US009862617B2

(12) United States Patent
Law et al.

(10) Patent No.: US 9,862,617 B2
(45) Date of Patent: Jan. 9, 2018

(54) METHOD TO SYNTHESIZE COLLOIDAL IRON PYRITE (FES$_2$) NANOCRYSTALS AND FABRICATE IRON PYRITE THIN FILM SOLAR CELLS

(71) Applicant: THE REGENTS OF THE UNIVERSITY OF CALIFORNIA, Oakland, CA (US)

(72) Inventors: Matthew Law, Irvine, CA (US); Sean Seefeld, Irvine, CA (US); James Puthussery, Tustin, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/749,212

(22) Filed: Jun. 24, 2015

(65) Prior Publication Data
US 2016/0101988 A1    Apr. 14, 2016

Related U.S. Application Data

(62) Division of application No. 13/079,697, filed on Apr. 4, 2011, now abandoned.
(Continued)

(51) Int. Cl.
*B05D 5/12*     (2006.01)
*C01G 49/12*    (2006.01)
(Continued)

(52) U.S. Cl.
CPC .............. *C01G 49/12* (2013.01); *B05D 1/005* (2013.01); *B05D 1/02* (2013.01); *B05D 1/18* (2013.01);
(Continued)

(58) Field of Classification Search
USPC .............................. 427/74, 126.1, 377, 383.1
See application file for complete search history.

(56) References Cited

U.S. PATENT DOCUMENTS 4,649,227 A    3/1987  Tributsch et al.
5,151,262 A *  9/1992  Pemsler ................ H01M 4/581
                                              423/561.1
(Continued)

FOREIGN PATENT DOCUMENTS

WO    WO 2010/080487 A1    7/2010

OTHER PUBLICATIONS

Antonucci, V., et al., "Photoactive screen-printed pyrite anodes for electrochemical photovoltaic cells", 1991, Solar Cells, vol. 31, pp. 119-141.
(Continued)

*Primary Examiner* — Brian K Talbot
(74) *Attorney, Agent, or Firm* — One LLP (57) ABSTRACT

Systems and methods are provided for the fabrication and manufacture of efficient, low-cost p-n heterojunction pyrite solar cells. The p-n heterojunction pyrite solar cells can include a pyrite thin cell component, a window layer component, and a top surface contact component. The pyrite thin cell component can be fabricated from nanocrystal paint deposited onto metal foils or microcrystalline pyrite deposited onto foil by chemical vapor deposition. A method of synthesizing colloidal pyrite nanocrystals is provided. Methods of manufacturing the efficient, low-cost p-n heterojunction pyrite solar cells are also provided.

19 Claims, 8 Drawing Sheets

Related U.S. Application Data (60) Provisional application No. 61/320,638, filed on Apr. 2, 2010.

(51) Int. Cl.

| | | |
|---|---|---|
| *B82Y 30/00* | (2011.01) | |
| *B82Y 40/00* | (2011.01) | |
| *C23C 16/30* | (2006.01) | |
| *C23C 16/44* | (2006.01) | |
| *H01L 31/032* | (2006.01) | |
| *H01L 31/072* | (2012.01) | |
| *B05D 1/00* | (2006.01) | |
| *B05D 1/02* | (2006.01) | |
| *B05D 1/18* | (2006.01) | |
| *C23C 16/22* | (2006.01) | |
| *C23C 16/56* | (2006.01) | |

(52) U.S. Cl.
CPC ............... *B82Y 30/00* (2013.01); *B82Y 40/00* (2013.01); *C23C 16/22* (2013.01); *C23C 16/305* (2013.01); *C23C 16/4417* (2013.01); *C23C 16/56* (2013.01); *H01L 31/032* (2013.01); *H01L 31/072* (2013.01); *C01P 2002/72* (2013.01); *C01P 2004/03* (2013.01); *C01P 2004/32* (2013.01); *C01P 2004/64* (2013.01); *C01P 2006/22* (2013.01); *Y02E 10/50* (2013.01)

(56) References Cited

U.S. PATENT DOCUMENTS

| | | | |
|---|---|---|---|
| 5,866,752 A * | 2/1999 | Goozner | B01D 53/007 |
| | | | 204/157.3 |
| 6,635,942 B2 | 10/2003 | La Vecchia | |
| 7,799,311 B2 * | 9/2010 | Schimek | B82Y 30/00 |
| | | | 423/511 |
| 8,425,865 B2 * | 4/2013 | Wadia | C01G 49/12 |
| | | | 423/138 |
| 2006/0112985 A1 | 6/2006 | Hantschel et al. | |
| 2007/0163635 A1 | 7/2007 | Nasuno et al. | |
| 2007/0202409 A1 * | 8/2007 | Yamakawa | H01M 4/5815 |
| | | | 429/231.95 |
| 2008/0092953 A1 | 4/2008 | Lee | |
| 2009/0178702 A1 | 7/2009 | Pichler | |
| 2011/0240108 A1 * | 10/2011 | Law | B82Y 30/00 |
| | | | 136/255 |
| 2013/0119346 A1 * | 5/2013 | Huang | H01L 31/0264 |
| | | | 257/21 |

OTHER PUBLICATIONS

Blenk, O., "Fabrication and Characterization of $FeS_2$ (Pyrite) for Photovoltaic Applications", PhD Thesis, 1995, University of Konstanz, Germany.

Chen, X., et al., "Single-Source Approach to Cubic $FeS_2$ Crystallites and Their Optical and Electrochemical Properties", 2005, Inorg, Chem., vol. 44, pp. 951-954.

Ennaoui, A., et al., "Preparation of Iron Disulfide and its Use for Solar Energy Conversion", Energy and the Environment: Into the 1990s, 1990, Conference: 1st. World Renewable Energy Congress. vol. 1, pp. 458-464.

Ennaoui, A., et al., "Photoelectrochemical Energy Conversion Obtained with Utrathin Organo-Metallic-Chemical-Vapor-Deposition Layer of $FeS_2$ (Pyrite) on $TiO_2$", 1992, J. Electrochem. Soc., vol. 139, No. 9, pp. 2514-2518.

Hillhouse, H. W., et al., "Solar cells from colloidal nanocrystals: Fundamentals, materials, devices, and economics", 2009, Current Opinion in Colloid & Interface Science, vol. 14, pp. 245-259.

"Sol (colloid)", Encyclopedia Britannica, <www.britannica.com/EBchecked/topic/552808/sol?sections=552808main&cit=mla&view=print>, retrieved Jun. 24, 2014.

Wadia, C., et al., "Surfactant-Assisted Hydrothermal Synthesis of Single phase Pyrite $FeS_2$ Nanocrystals", 2009, Chem. Matter., vol. 21, pp. 2568-2570.

* cited by examiner

METHOD TO SYNTHESIZE COLLOIDAL IRON PYRITE (FES$_2$) NANOCRYSTALS AND FABRICATE IRON PYRITE THIN FILM SOLAR CELLS

CROSS-REFERENCE TO RELATED APPLICATIONS

This application is a divisional application of U.S. Ser. No. 13/079,697, filed Apr. 4, 2011, now abandoned, which claims the benefit of provisional application Ser. No. 61/320, 638, filed Apr. 2, 2010, which are fully incorporated herein by reference.

FIELD

The embodiments relate generally to solar cells and nanocrystal-based solar cell devices, and more particularly to iron pyrite thin film solar cell devices.

BACKGROUND

The current annual global energy demand of ~14 terawatt-years (TW-yrs) is expected to double by mid-century and triple by the end of the century. Such a large increase in energy demand cannot be met by the existing carbon-based technologies without further destabilizing the climate. The sun is the largest source of carbon-free energy (120,000 TW-yrs strike the planet's surface annually) and can be used to produce both electricity and fuel. Yet in the United States, solar electricity (e.g. photovoltaics) and solar-derived fuels (e.g. biomass) currently provide about 1 millionth of the total electricity supply and less than 0.1% of total energy consumption, respectively.

An area of great promise for low-cost solar energy conversion is inorganic thin-film photovoltaics (PV). Thin-film PV has the potential to revolutionize the photovoltaics industry via cheaper processing and eliminating the use of expensive silicon wafers that account for over 50% of total manufacturing cost of traditional silicon-based PV. Current thin-film technology is based on amorphous silicon, CdTe, and CIGS (copper indium gallium diselenide) as the active absorber layers. These materials can be made 50-100 times thinner than traditional silicon cells because of their larger optical absorption coefficients. The resulting lower cost per peak watt ($/Wp) is driving the extraordinary market growth of thin-film PV, which is projected to account for 28% of the solar market by 2012 (at $19.7 billion in sales). CdTe and CIGS are currently the most favored of the thin-film technologies due to their high laboratory cell efficiencies (16.5% for CdTe and 19.9% for CIGS) and because amorphous silicon encounters certain stability problems. However, the future market share and societal impact of CdTe and CIGS PV will be limited by the scarcity of tellurium (Te) and indium (I) in the Earth's crust. Most projections conclude that price constraints on tellurium and indium will limit CdTe and CIGS to 0.3 TWs or less of total solar conversion capacity, which falls far short of the tens of terawatts of carbon-free energy that are needed to meet the global energy challenge. To enable the rapid expansion of PV to the multi-TW scale, it is essential to develop alternative thin-film PV materials based on common (rock-forming) elements and inexpensive manufacturing processes.

Pyrite iron persulphide (β-FeS$_2$, hereafter "pyrite") is an under researched, extremely promising semiconductor for use as the active light-absorbing layer in thin-film PV. Pyrite offers a suitable bandgap ($E_g$=0.95 eV), strong light absorption ($\alpha$>10$^{-5}$ cm$^{-1}$ for hv>1.3 eV), an adequate minority carrier diffusion length (100-1000 nm), and essentially infinite elemental availability, making it a particularly exciting material for multi-terawatt PV deployment. In principle, all of the United States' primary power demand (~3.5 TW) can be met with 10% of the pyrite that is disposed of annually as mining waste in six U.S. states alone (even conservatively assuming a 5-micron thick pyrite active layer and 10% cell efficiency). One of pyrite's major strengths is that iron and sulfur will remain extremely cheap regardless of demand, even at multi-TW levels of PV deployment.

Iron pyrite is best described as Fe$^{2+}$S$_2^{2-}$ in which the sulfur atoms are paired into persulfide dimers. The crystal structure is rock salt (space group Pa3) with an fcc sublattice of Fe$^{2+}$ ions and sulfur dumbbells pointed along the <111> directions occupying the anion sites. This arrangement results in a slightly distorted octahedral coordination for Fe$^{2+}$, which exists in its diamagnetic d$^6$ configuration, and tetrahedral coordination of each sulfur atom to three iron ions and its dimer partner. Four formula units make up the unit cell. The basic electronic structure of pyrite has been the subject of extensive experimental and theoretical studies. The top of the valence band is formed by the overlap of nonbonding Fe 3d t$_{2g}$ orbitals, while the bottom of the conduction band is mostly Fe e$_g$* states, with some hybridization of S 3p orbitals at higher energy.

Pyrite thin films have been prepared by many techniques, including the sulfurization of iron thin films, direct sputtering of FeS$_2$, flash evaporation, electrodeposition, spray pyrolysis, and chemical vapor deposition (CVD). Pyrite thin films can be doped p-type with P, As or Sb, and n-type with Co, Cl or Br.

The research group of Helmut Tributsch at the Hahn-Meitner Institüt (now the Helmholtz Centre for Materials and Energy) investigated pyrite intensively for PV and photoelectrochemical cells beginning in 1983. Much of what is known about the synthesis and basic materials properties of pyrite for solar applications originates from the pioneering work of this laboratory and its collaborators. The Tributsch group developed several techniques for the preparation of single crystals and thin pyrite layers, studied the photoelectrochemistry of natural and synthetic samples, and reported the first pyrite solar cells in 1984. These initial devices were based on Schottky junctions with certain metals or liquid electrolytes and showed large photocurrents, small photovoltages, and efficiencies of ~1%. Subsequent progress in improving the efficiency of pyrite devices has been extremely modest. In 1990, Tributsch reported a 2.8% efficient photoelectrochemical cell using an n-FeS$_2$ single crystal in an aqueous iodide/triiodide electrolyte. See Ennaoui, A. et. al., "World Renewable Energy Congress. Energy and the Environment," Ed. Sayigh, A. A. M. (Pergamon Press, Oxford, 1990) p. 458. Shortly thereafter, Antonucci found that heat treating pyrite in H$_2$ produced a photoelectrochemical device with a higher photovoltage (460 mV), respectable current, and an efficiency as high as 3.3%; though suggestive that annealing treatments can boost pyrite V$_{OC}$, nothing resulted from this work over the following twenty years. See Antonuccia, V., et. al., "Photoactive Screen-Printed Pyrite Anodes for Electrochemical Photovoltaic Cells," Solar Cells 1991, 31, 119-141. The only other devices of note are pyrite-sensitized TiO$_2$ nanocrystal photoelectrochemical cells reported in 1992 and p-n homojunction cells described in a thesis in 1995. See Ennaoui, A., et. al., "Photoelectrochemical Energy Conversion Obtained With Ultrathin Organo-Metallic-Chemical-Vapor-Deposition Layer of FeS$_2$ (Pyrite) on TiO$_2$," Journal of the Electrochemical Society 1992, 139, 2514-2518; see also Blenk, O., "Fabrication and Characterization of $FeS_2$ (Pyrite) for Photovoltaic Applications," Ph.D. Thesis, University of Konstanz, Germany, 1995.

The major limitation on the conversion efficiency of pyrite cells is the low open-circuit voltage, which typically does not exceed 200 mV (~20% of the band gap) at room temperature. This low photovoltage is blamed on band gap states created by sulfur vacancies in the bulk and at the surface of the material. Pyrite commonly exhibits a sulfur deficit of up to several percent. The defects are thought to be Schottky vacancies distributed homogeneously within the crystal. Sulfur deficiency lowers the iron coordination number from six to five and reduces the point-group symmetry of the iron coordination polyhedron from $O_h$ to $C_{4v}$. This change in the ligand field causes one of the Fe $e_g^*$ states to relax into the forbidden gap, where it can act as a deep trap for carriers. These iron-derived mid-gap states are an intrinsic feature of pyrite surfaces on which Fe—S bonds have been cleaved (e.g., 100 and 111 surfaces).

The effect of a particular sulfur vacancy depends on whether it occurs in the bulk or at the crystal surface. The high quantum yield of sulfur-deficient pyrite suggests that bulk vacancies do not necessarily act as efficient recombination centers. Nevertheless, a sufficiently high density of bulk vacancies will give rise to a defect band that decreases the band gap, and thus the photovoltage, of the material. Bulk sulfur vacancies also appear to act as dopants in pyrite. Relative to bulk defects, surface sulfur vacancies seem to have a more deleterious effect on the performance of pyrite devices. The large concentration of five-coordinate iron ions at the surface necessarily creates a high density of mid-gap surface states, and these states limit the photovoltage by narrowing the surface band gap, pinning the Fermi level and acting as recombination centers. Sulfur vacancies at the crystal surface also lead to FeS-like layers (which are quasi-metallic), oxides, and other defects that introduce additional traps and recombination centers, increase the dark current, and further reduce the photovoltage of pyrite samples.

Surface states are especially important for pyrite because carriers are generated close to the surface due to its very large optical absorption coefficient. The complexity of pyrite defect chemistry, combined with the low level of funding devoted to this material since the first demonstration of pyrite solar cells, explains why pyrite has not attained a more advanced level of development as a practical material for solar energy conversion, despite its great promise. Therefore, Pyrite-based devices with enhanced photovoltage and efficiency are desirable.

SUMMARY

The embodiments provide for, in part, systems and methods for fabricating and making efficient, low-cost p-n heterojunction pyrite solar cells.

In one embodiment, the p-n junction pyrite solar cell system includes a p-type pyrite thin film layer, an n-type emitter window layer, and a top surface contact. In a further embodiment, p-n junction pyrite solar cell system comprises a conductive bottom substrate (for example, flexible metal foil) acting as an electrical contact; a pyrite thin film layer produced from sintered pyrite nanocrystals (NCs) or chemical vapor deposition; a semiconductor window layer consisting of, for example, zinc sulfide or cadmium sulfide, used to form a junction with the pyrite thin film layer to create a photovoltaic effect; a transparent top contact, for example doped zinc oxide; and an encapsulation component. In addition, the p-n junction pyrite solar cell system can include an adhesion layer and/or busbars or other current-collecting structures.

To develop an efficient p-n junction pyrite solar cell system, two exemplary methods of fabricating p-type pyrite thin film are presented. The first embodiment is directed to a method of synthesizing high-quality pyrite nanocrystal (NC) thin films from stable colloidal dispersions of single-crystalline, phase-pure pyrite NCs and then sintering the NC films in sulfur at moderate temperatures to produce large-grain polycrystalline pyrite films promising for the p-type pyrite thin film layer of p-n junction pyrite solar cell system. Pyrite NCs are of particular interest for low-cost solar energy conversion because of the prospect of fabricating inexpensive, large-area modules by the roll-to-roll printing or spraying of NC "solar paint" onto flexible metal foils. Nanocrystal-based devices can achieve excellent manufacturing scalability at lower cost ($/W_p$) than conventional single-crystal Si and existing thin film technologies.

The second embodiment is directed to a method of fabricating p-type pyrite thin film into high-quality, microcrystalline stoichiometric pyrite thin films by depositing microcrystalline pyrite onto a substrate layer by metal-organic chemical vapor deposition (MO-CVD). CVD is the best gas-phase process for depositing pyrite because it offers superior control of film morphology, purity and doping compared with alternative gas-phase methods (e.g., evaporation, sputtering, sulfurization of iron films, etc.).

The systems and methods described herein also provide for numerous methods of fabricating and manufacturing the p-n junction pyrite solar cell system.

One exemplary embodiment is directed to a method of manufacture of an efficient, low-cost p-n junction pyrite solar cell system from pyrite NC paints. Nanocrystalline pyrite films are made by dip coating, spraying, inkjet printing, or doctor blading the pyrite NC paint onto a substrate layer. These films are then sintered in special gas mixtures to yield stoichiometric polycrystalline pyrite films with carrier diffusion lengths that are significantly longer than the average optical absorption length. The surfaces of the films are then passivated chemically to increase the surface band gap and reduce the surface recombination velocity. A window layer is then deposited by chemical bath deposition (CBD), or other suitable deposition methods, such as atomic layer deposition (ALD), or chemical vapor deposition (CVD). The transparent top surface contact is then deposited by sputtering, CBD, ALD, or another suitable method.

Another exemplary embodiment is directed to a method of manufacture of an efficient, low-cost p-n junction pyrite solar cell system from depositing microcrystalline pyrite onto a substrate layer by chemical vapor deposition (CVD). High-quality, stoichiometric pyrite thin films are synthesized by growing p-type pyrite films on a substrate layer by CVD. These films are then sintered in special gas mixtures to yield stoichiometric polycrystalline pyrite films with carrier diffusion lengths that are significantly longer than the average optical absorption length. The surfaces of these thin films are then passivated chemically to increase the surface band gap and reduce the surface recombination velocity. A window layer is then deposited by chemical bath deposition (CBD), or other suitable deposition methods, such as atomic layer deposition (ALD), or chemical vapor deposition (CVD). The transparent top surface contact is then deposited by sputtering, CBD, ALD, or another suitable method.

To carry out the aforementioned methods of manufacture of an efficient, low-cost p-n junction pyrite solar cell system, exemplary embodiments of chemical passivation techniques are presented. Chemical passivation techniques are used to enhance photovoltage of p-type pyrite thin film to make them commercially useful for solar cells by eliminating iron-deprived gap states resulting from sulfur deficiency.

One embodiment of these chemical passivation techniques is directed to a method of passivating defect states within the bandgap of the p-type pyrite thin film by moderate-temperature annealing in $S_2$, $H_2S$, and $H_2$ atmosphere. Another embodiment of these chemical passivation techniques is directed to a method of passivating defect states within the bandgap of the p-type pyrite thin film by coordination of surface iron with organic or inorganic ligands. A third embodiment of these chemical passivation techniques is directed to a method of passivating defect states within the bandgap of the p-type pyrite thin film by controlled alloying at the pyrite/window junction to grade the pyrite band gap and eliminate surface states.

Another embodiment is directed to a method of forming a p-n heterojunction between the passivated p-type pyrite thin film and the n-type emitter window layer. According to one embodiment, the n-type emitter window layer is a thin, wide bandgap semiconductor. The p-n heterojunction between the passivated p-type pyrite thin film and the n-type emitter window layer can be prepared by the following methods and techniques: chemical bath deposition (CBD); atomic layer deposition (ALD); and ZnS window layers made by low-temperature CVD of diethyl zinc and H2S at 200° C. in a commercial reactor.

Another embodiment of the p-n junction pyrite solar cell system is directed methods of depositing a transparent top surface contact. The top surface contact can be deposited by the following exemplary methods: sputtering; ALD; or other suitable methods.

According to one embodiment, the p-type pyrite thin film includes an ohmic, low-resistivity contact between the pyrite layer and the substrate layer.

In another embodiment, the p-n junction pyrite solar cell system can include an adhesion layer and/or busbars or other current-collecting structures.

In another embodiment of p-n junction pyrite solar cell system, the p-type pyrite thin film includes an ohmic, low-resistivity contact between the pyrite layer and the substrate layer.

BRIEF DESCRIPTIONS OF THE FIGURES

The details of the embodiments, including fabrication, structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIGS. 2(a)-(g) illustrate basic structural characterization of the purified colloidal pyrite NCs. FIGS. 2(a)-(b) depict the NCs as a mixture of oblate and spheroidal single crystals with diameters ranging from 5-20 nm.

FIGS. 4(a)-(b) depict colloidal pyrite nanocrystals made in solution, where

DETAILED DESCRIPTION

The embodiments provided herein are directed to systems and methods for fabricating and making efficient, low-cost p-n heterojunction pyrite solar cells by eliminating the surface defects that currently restrict the pyrite surface photovoltage to ~200 mV. These breakthrough efficiencies are achieved by passivating the pyrite surface through judicious annealing and ligand coordination schemes designed to eliminate gap states and boost the photovoltage of the pyrite surface to ~600 mV. The efficient, low-cost p-n heterojunction pyrite solar cells comprise an optimized p-type pyrite thin film, which is fabricated using two distinct solution-phase and gas-phase technologies. The solution-phase approach involves fabricating stoichiometric microcrystalline pyrite thin films from pyrite "nanocrystal paint" deposited onto metal foils by printing or similar method. The gas-phase approach relies on depositing microcrystalline pyrite onto foil by chemical vapor deposition (CVD). Both approaches are amenable to inexpensive, large-area roll-to-roll manufacturing. Optimized pyrite films produced by these two methods are chemically passivated and then coated with a window layer (e.g., ZnS) to produce a heterojunction cell similar in design to commercial CdTe and CIGS devices.

Figure 1:
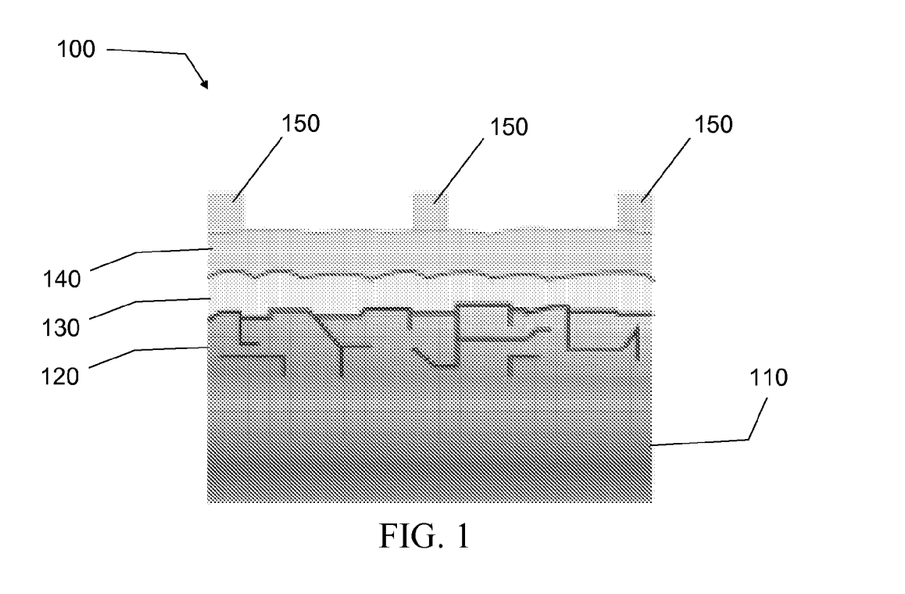
FIG. 1 depicts a preferred embodiment of a p-n junction pyrite solar cell system.
Figure 2A:
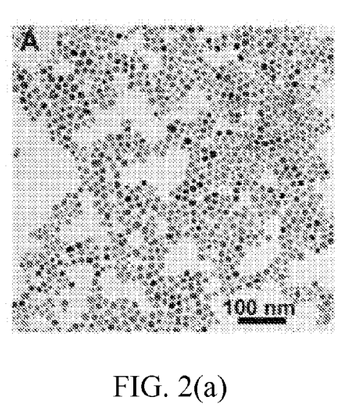
Figure 2B:
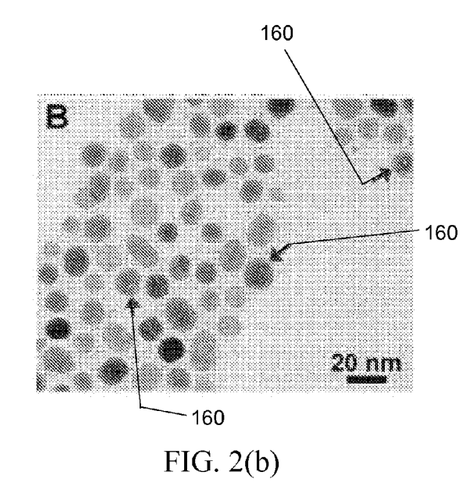
Figure 2C:
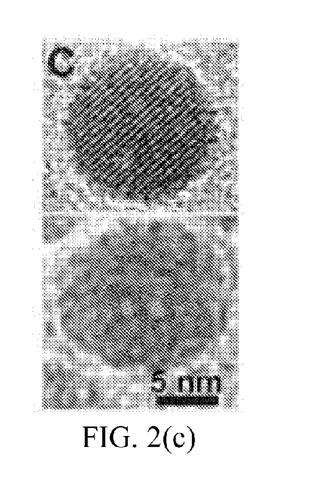
FIG. 2(c) depicts exemplary lattice-resolved images of the NCs.
Figure 2D:
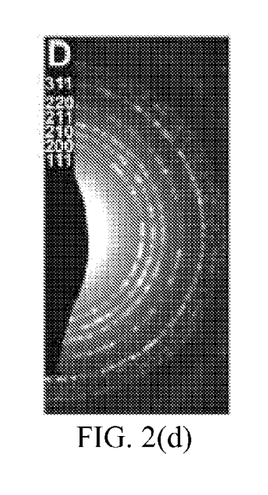
FIGS. 2(d)-(e) depict exemplary images and measurements of the NCs illustrated that the NCs are single-phase pyrite without detectable marcasite, greigite, pyrrhotite, or other impurities.
Figures 2E, 2F:
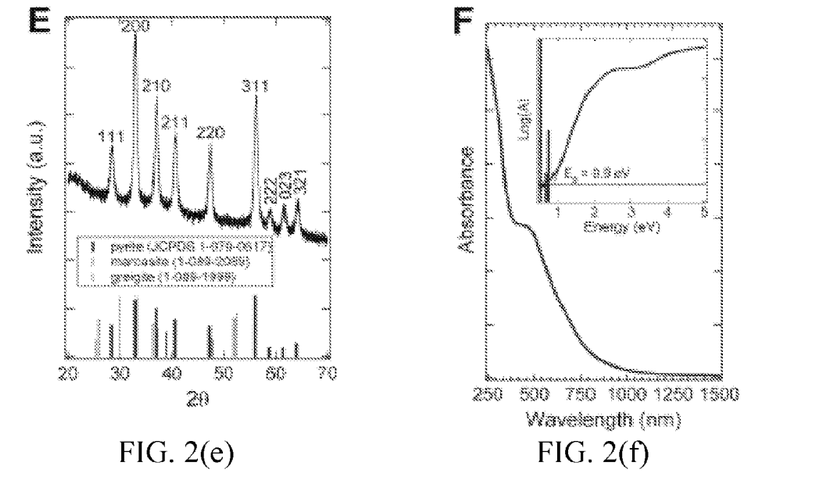
FIG. 2(f) depicts an exemplary measurement indicating an absorption onset of ~0.9 eV and a slow, monotonic absorption rise with a shoulder at ~2.85 eV.
Figure 2G:
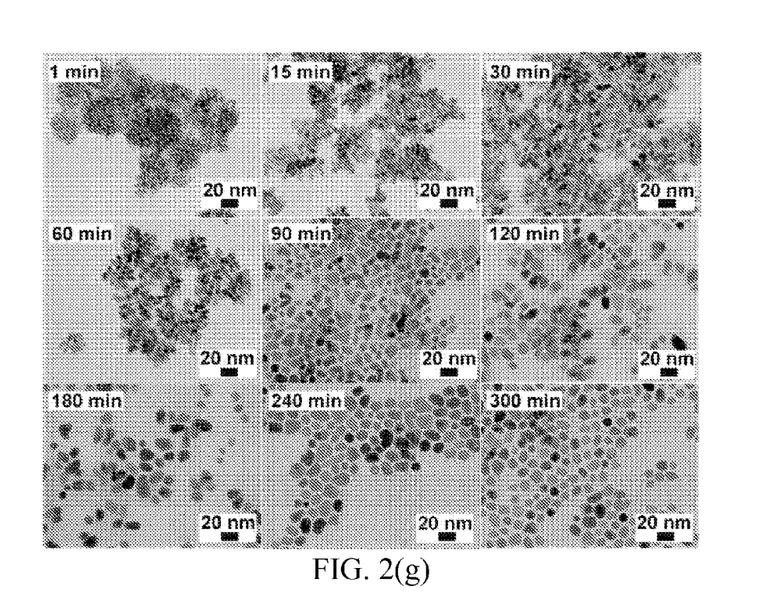
FIG. 2(g) is a series of transmission electron microscopy (TEM) images of aliquots removed at different stages of the reaction.

FIG. 1 depicts a preferred embodiment of p-n junction pyrite solar cell system 100. As depicted, p-n junction pyrite solar cell system 100 includes p-type pyrite thin film 120, n-type emitter window layer 130, and top surface contact 140.

To develop an efficient p-n junction pyrite solar cell system 100, two exemplary methods of fabricating p-type pyrite thin film 120 are presented. As described in greater detail below, the first exemplary method of fabricating p-type pyrite thin film 120 involves producing large-grain polycrystalline pyrite films from pyrite nanocrystal (NC) paint deposited onto a substrate layer 110 by printing, or similar methods. The second exemplary method of fabricating p-type pyrite thin film 120, also described in greater detail below, involves microcrystalline pyrite deposited onto substrate layer 110 by chemical vapor deposition (CVD).

The first embodiment is directed to a method of synthesizing high-quality pyrite NC thin films from stable colloidal dispersions of single-crystalline, phase-pure pyrite NCs and then sintering the NC films in sulfur at moderate temperatures to produce large-grain polycrystalline pyrite films, which are promising for the p-type pyrite thin film 120 layer of p-n junction pyrite solar cell system 100.

Pyrite NCs are of particular interest in low-cost solar energy conversion because of the prospect of fabricating inexpensive, large-area photovoltaics by roll-to-roll deposition of NC solar ink or paint on flexible substrates. NC-based photovoltaics processed from solution may offer excellent manufacturing scalability at very low cost compared to conventional single crystal and thin film approaches.

In one embodiment, colloidal pyrite NCs are synthesized by the following method. In a container, such as a three-neck flask, a reaction solution is created by mixing $FeCl_2 \cdot 4H_2O$ (100 mg, 0.5 mmol) with octadecylamine (10 g, 0.14 mol) and degassing the reaction solution for one hour at 120° C. In a separate pot, an injection solution consisting of sulfur (96 mg, 3 mmol) is injected and dissolved in diphenyl ether (5 mL) and degassed at 70° C. for one hour. The temperature of the reaction solution is then raised to 220° C. The injection solution is then added, e.g., by a syringe, to the reaction solution and the reaction mixture is kept at 220° C. for several hours. The reaction is then quenched with a water bath. To prevent the octadecylamine from solidifying, anhydrous chloroform (9 mL) may be injected into the solution once its temperature falls below 100° C. The NCs are then separated from the reaction mixture by precipitation using ethanol. The precipitate is further purified by washing with chloroform/ethanol mixtures. Subsequent addition of chloroform followed by centrifugation at 4400 rpm for 5 minutes removes the largest NCs and any residual side products from the NC suspension.

It is appreciate that the colloidal pyrite NC synthesis reaction can be carried out using a variety of starting chemical materials and synthesis parameters. For example, in one embodiment, the injection solution may consists of different solvents of varying coordinating power, e.g., tri-n-octylphosphine oxide (TOPO), octadecene, other nonpolar organic solvents, or water. In another embodiment, the reaction mixture of the reaction solution and injection solution can be heated to a temperature ranging from 200-250° C. In another embodiment, the reaction mixture can be heated for a period of time ranging from 2-4 hours.

FIGS. 2(*a*)-(*g*) illustrate basic structural characterization of the purified colloidal pyrite NCs. FIG. 2(*a*) depicts the NCs as a mixture of oblate and spheroidal single crystals with diameters ranging from 5-20 nm. As noticed in FIG. 2(*b*), many of the NCs have doughnut-like appearances 160, with depressions or holes in their centers. The lattice-resolved images depicted in FIG. 2(*c*) illustrate that the NCs possess crystalline surfaces with no sign of an oxide coating or amorphous overlayer. As illustrated in FIGS. 2(*d*)-(*e*), NCs are single-phase pyrite without detectable marcasite, greigite, pyrrhotite, or other impurities. FIG. 2(*f*) indicates an absorption onset of ~0.9 eV and a slow, monotonic absorption rise with a shoulder at ~2.85 eV. Transmission electron microscopy (TEM) images of aliquots removed at different stages of the reaction, as illustrated in FIG. 2(*g*), reveal that the doughnut-like appearance of the NCs form via the fusion of several smaller, irregularly-shaped pyrite NCs, which themselves gradually nucleate from an amorphous iron sulfide matrix present in the solution at lower temperatures. The amorphous material is consumed over several hours at the reaction temperature to yield colloidal pyrite NCs.

Figure 3A:
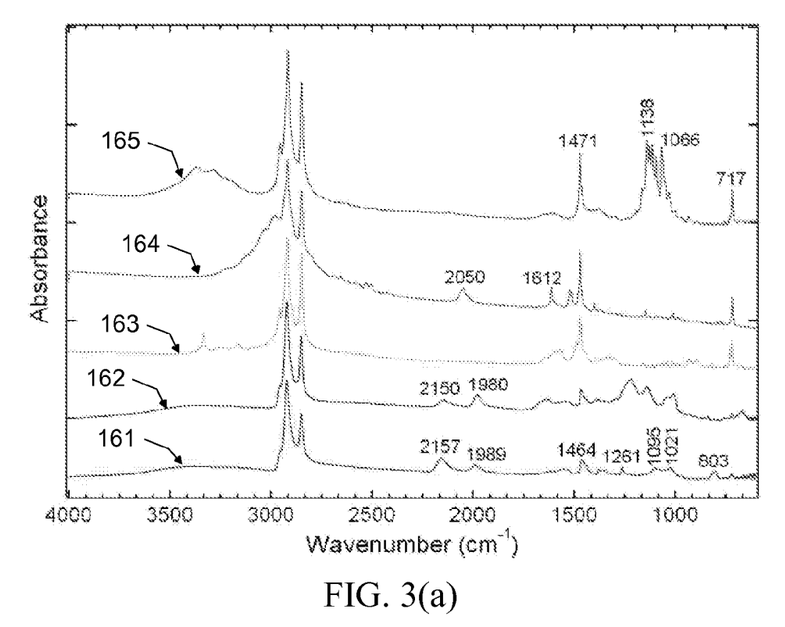
FIGS. 3(a)-(b) are Fourier transform infrared spectroscopy (FTIR) measurements of pyrite NCs before and after treatment with octadecylxanthate.
Figure 3B:
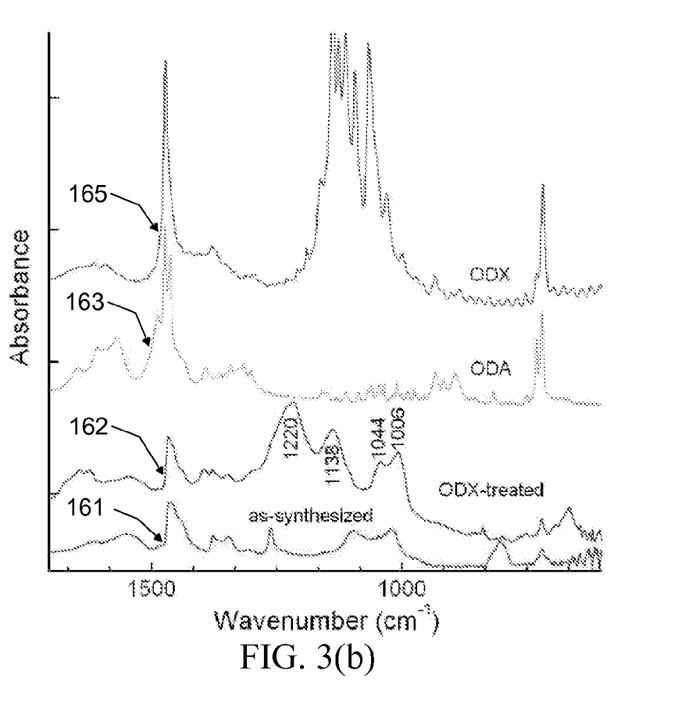

In one embodiment, long-chain xanthates are used as ligands to stabilize the colloidal pyrite NC inks Pyrite NC samples are treated with octadecylxanthate ($C_{18}H_{37}OCS_2^-$) by adding potassium octadecyaxanthate (100 mg, 0.5 mmol) to a solution of pyrite NCs (200 mg) dissolved in chloroform. After stirring for 12 hours, the NCs are precipitated and resuspended 2-3 times using anhydrous chloroform/ethanol. FIGS. 3(*a*)-(*b*) illustrate Fourier transform infrared spectroscopy (FTIR) measurements of pyrite NCs before 161 and after 162 treatment with octadecylxanthate. Reference spectra measurements for octadecylamine (ODA) 163, octadecylammonium chloride (ODACl) 164, and octadecylxanthate (ODX) 165 are also depicted. As illustrated in FIGS. 3(*a*)-(*b*), the presence of octadecylxanthate species on the NC surfaces are confirmed where clear signatures of absorbed xanthates and/or dixanthogens appear in the 1000-1250 $cm^{-1}$ regions of the spectra measurements.

In one embodiment, potassium octadecylxanthate is synthesized by adding powdered KOH (2.24 g, 0.04 mol) to 1-octadecanol (10.82 g. 0.04 mol) at 100° C. The mixture is then heated to 150° C. and stirred for 30 minutes to form a uniform slurry. The slurry is then cooled down to 100° C. and, in one embodiment, 25 mL toluene is added to form a suspension. Carbon disulfide (3.50 g, 0.085 mol) is then added dropwise to the mixture at room temperature under vigorous stirring. In another embodiment, the mixture is further diluted by adding 100 mL of hexane and stirred for 2 hours. The precipitate is then filtered and washed several times with cold water followed by hexane. While the present embodiment uses potassium octadecylxanthate as a surface ligand, it is appreciated that other surface ligands capable of stabilizing the colloidal pyrite NC inks—for example, alkylammonium and alkylxanthates—can be used.

Figure 4A:
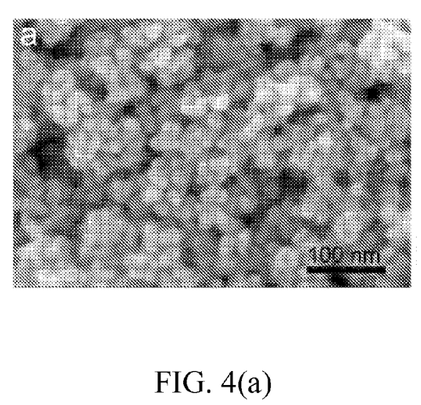
FIG. 4(a) depicts an SEM image showing a porous film of pure pyrite NCs with 10-20 nm diameters.
Figure 4B:
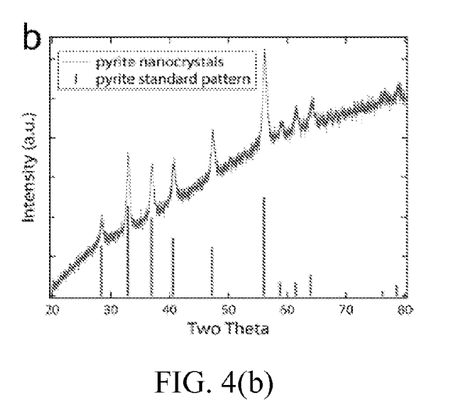
FIG. 4(b) depicts an X-ray diffraction pattern of the sample colloidal pyrite NC sample.

FIGS. 4(*a*)-(*b*) depict an SEMS image showing a porous film of pure pyrite NCs and an X-ray diffraction pattern of the same sample of an exemplary synthesis based on the reaction of iron salts and sulfur in a coordinating surfactant at 150-250° C., wherein the porous film of pure pyrite NCs are 10-20 nm in diameter.

The synthesis of high-quality, phase-pure, monodisperse colloidal pyrite NCs for fabrication of p-type pyrite thin film 120 for solar energy applications, including solar cells, has many advantages. For example, synthesizing high-quality, phase-pure, monodisperse colloidal pyrite NCs: (i) advantageously scales to large volumes, (ii) yields pure pyrite with no other phases present, (iii) yields single-crystalline, colloidal and well-dispersed NCs suitable for solution processing, (iv) yields NCs 5-25 nm in diameter, (v) yields solutions that are stable for long periods of time, (vi) is environmentally benign, and (vii) requires a low-temperature solution phase process.

The purified colloidal NCs are dispersed in aqueous or organic media to make low-viscosity pyrite NC paints for printing and spraying or high-viscosity pyrite NC pastes for spreading onto substrate layer 110. Key characteristics of the NC paint and paste materials include high purity, long shelf life (i.e., colloidal stability), low cost, and low toxicity.

The next step of fabricating p-type pyrite thin film 120 requires the low-viscosity pyrite NC paints or high-viscosity pyrite NC pastes to be deposited onto substrate layer 110. In a preferred embodiment, substrate layer 110 is metal foil. The use of a variety of different substrates, however, can serve as the substrate layer 110 in pyrite thin film 120. For example, glass, quartz, silicon, and other flexible substrates such as metal foils (steel, aluminum, copper, etc.) that are electrically conductive can serve as the substrate layer 110 in p-type pyrite thin film 120.

In one embodiment, thin-film colloidal pyrite NCs are deposited on substrate layer 110 by dipping substrate layer 110 repeatedly in the purified colloidal NC solution and a 1M hydrazine solution in acetonitrile using a dip coater (such as, e.g., a DC Multi-4 from Nima Technology). In one embodiment, the concentration of purified colloidal NC solution used for dip coating can vary from 4 to 6 mg/mL. Likewise, the thickness of the nanocrystal films can vary from 150 nm to 3 μm by changing the number of dipping cycle from 5 to 100. Thin-film colloidal pyrite NCs may also be deposited onto substrate layer 110 by other methods/techniques. For example, deposition techniques may include: spraying; inkjet printing; or doctor blading with an automated setup.

To produce high-quality (i.e., pinhole-free, dense, adherent and optically flat) p-type pyrite thin film 120, excellent control of pyrite thin film 120 thickness (from 50-1000 nm), flatness (to within +/−10% of the thickness), and density (from 75-100% full density) is achieved by controlling the deposition of the NCs as well as the sintering temperature, time, atmosphere, ramp rates, and other processing parameters. Pyrite thin films 120 less than one micron thick are sufficient for complete absorption of the solar spectrum. Pyrite thin film 120 thickness must be precisely controlled from 50-1000 nm in order to facilitate solar cell fabrication and testing.

High-quality p-type pyrite thin film 120 is then sintered in $S_2$-containing atmosphere to produce high-quality, large-grain stoichiometric pyrite thin films suitable for solar cells. The purpose of sintering pyrite thin-film 120 is to increase the grain size, densify the films, and increase the carrier diffusion length as much as possible. Sintering is also used to remove unwanted impurities and introduce desirable impurities (dopants) that modulate the electronic properties of the pyrite thin films. Since pyrite is prone to losing sulfur at moderate temperatures, and since sulfur deficiency limits the photovoltage of pyrite devices, any sintering process should be carried out in sulfur vapor. Careful, moderate-temperature sintering in $S_2$ atmosphere is expected to yield stoichiometric, microcrystalline pyrite thin-films with carrier diffusion lengths that are significantly longer than the average optical absorption length.

According to one embodiment, NC films on 1 $cm^2$ substrate layer 110 are transferred into quartz tubes (1.3 cm×15 cm) closed at one end and containing 50-100 mg of elemental sulfur. After thoroughly evacuating and flushing the tube with argon three times, the tube is flame-sealed under a low pressure of argon. The ampoules are then placed in a preheated furnace held at 540° C. After sintering for 4 hours at 540° C., the quartz tubes re removed from the oven and cooled to room temperature.

Figure 5A:
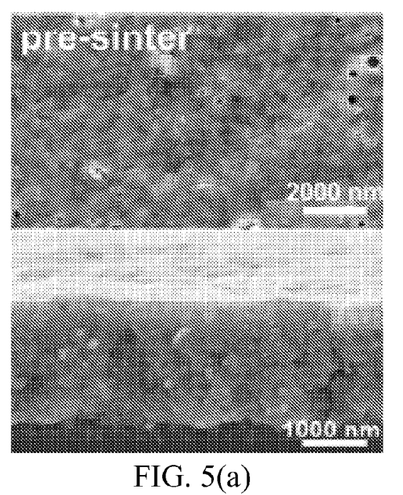
FIG. 5(a)-(b) are plan-view and cross-section scanning electron microscope (SEM) images of a 2000-nm thick pyrite NC film on a glass substrate before (FIG. 5(a)) and after (FIG. 5(b)) sintering at 540° C. for 4 hours.
Figure 5B:
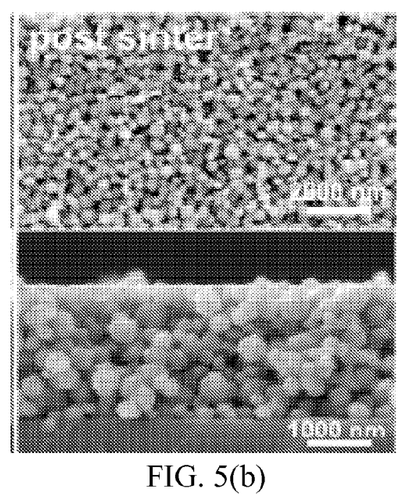

FIGS. 5(a)-(b) shows plan-view and cross-section scanning electron microscope (SEM) images of a 2000-nm thick pyrite NC film on a glass substrate before (FIG. 5(a)) and after (FIG. 5(b)) sintering at 540° C. for 4 hours. Under these conditions, sintering results in significant grain growth (average apparent grain size of ~300 nm based on the SEM images and XRD), roughening of the film surface, and the formation of voids. In general, the microstructure obtained after sulfurization is a strong function of the film thickness, sintering temperature and time, ramping rates, sulfur partial pressure, and substrate. Higher temperatures yield larger crystallites (up to ~1 μm) and usually poorer inter-grain connectivity and substrate coverage. Higher sulfur partial pressures also favor larger grains but with better grain connectivity and fewer voids.

According to another embodiment, various process and dopant gases (e.g., $H_2$, $H_2S$, $PH_3$, $Cl_2$) can be introduced during sintering, with all process parameters under computer control. Temperatures of 200-600° C. is preferred to produce microcrystalline pyrite, depending on the original size of the NCs and the particular process conditions. It is appreciated that control of the sulfur vapor pressure, ramping rates, and sintering time helps to avoid potential risk associated with sintering such as potential phase changes or phase separation, or pinhole formation, cracking, or delamination of pyrite thin film 120 from substrate layer 110 during cooling.

The second embodiment is directed to a method of fabricating p-type pyrite thin film 120 into high-quality, microcrystalline stoichiometric pyrite thin films by depositing microcrystalline pyrite onto substrate layer 110 by metal-organic chemical vapor deposition (MO-CVD). CVD is the best gas-phase process for depositing pyrite because it offers superior control of film morphology, purity and doping compared with alternative gas-phase methods (e.g., evaporation, sputtering, sulfurization of iron films, etc.). In a preferred embodiment, the substrate layer 110 is a metal foil. The use of a variety of different substrates, however, can serve as the substrate layer 110 in pyrite thin film 120. In particular, other flexible metal foil substrates (molybdenum, steel, aluminum, copper, etc.) that are electrically conductive can serve as the substrate layer 110 in p-type pyrite thin film 120. Other substrates such as glass and silicon can also serve as the substrate layer 110 in p-type pyrite thin film 120.

Figure 6:
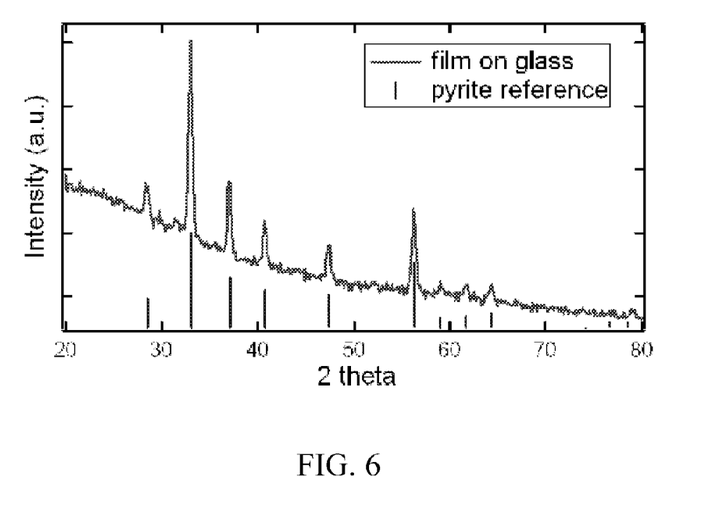
FIG. 6 depicts an X-ray diffraction pattern of a CVD pyrite thin film on a glass substrate.

According to the present embodiment, high-quality, phase-pure, 50-1000 nm-thick pyrite films on metal foil are synthesized using an atmospheric-pressure MO-CVD system. In one embodiment, phase-pure, polycrystalline pyrite thin films are synthesized from iron (III) acetylacetonate or iron (III) chloride and tent-butyl disulfide on glass and silicon substrates at a temperature of 250-550° C. FIG. 6 depicts an X-ray diffraction pattern of this synthesized phase-pure, polycrystalline CVD pyrite thin film on a glass substrate. According to another embodiment, high-quality, phase-pure pyrite thin films are synthesized using a conventional, computer-controlled CVD system. One example of a conventional, computer controlled CVD system is a cold wall research-grade system capable of handling 2-inch substrates and features low-pressure operation with four heated liquid sources, one heated solid source, full computer control of all process parameters, a load lock, automated safety gas cabinet for $Fe(CO)_5$ and $PH_3$ (p-type dopant), and an exhaust gas conditioning system (scrubber). This type of CVD system is preferred if pyrite films are to be made of sufficiently high quality for meaningful surface analysis.

The systems and methods described herein also provide for numerous methods of fabricating and manufacturing p-n junction pyrite solar cell system 100.

Figure 7:
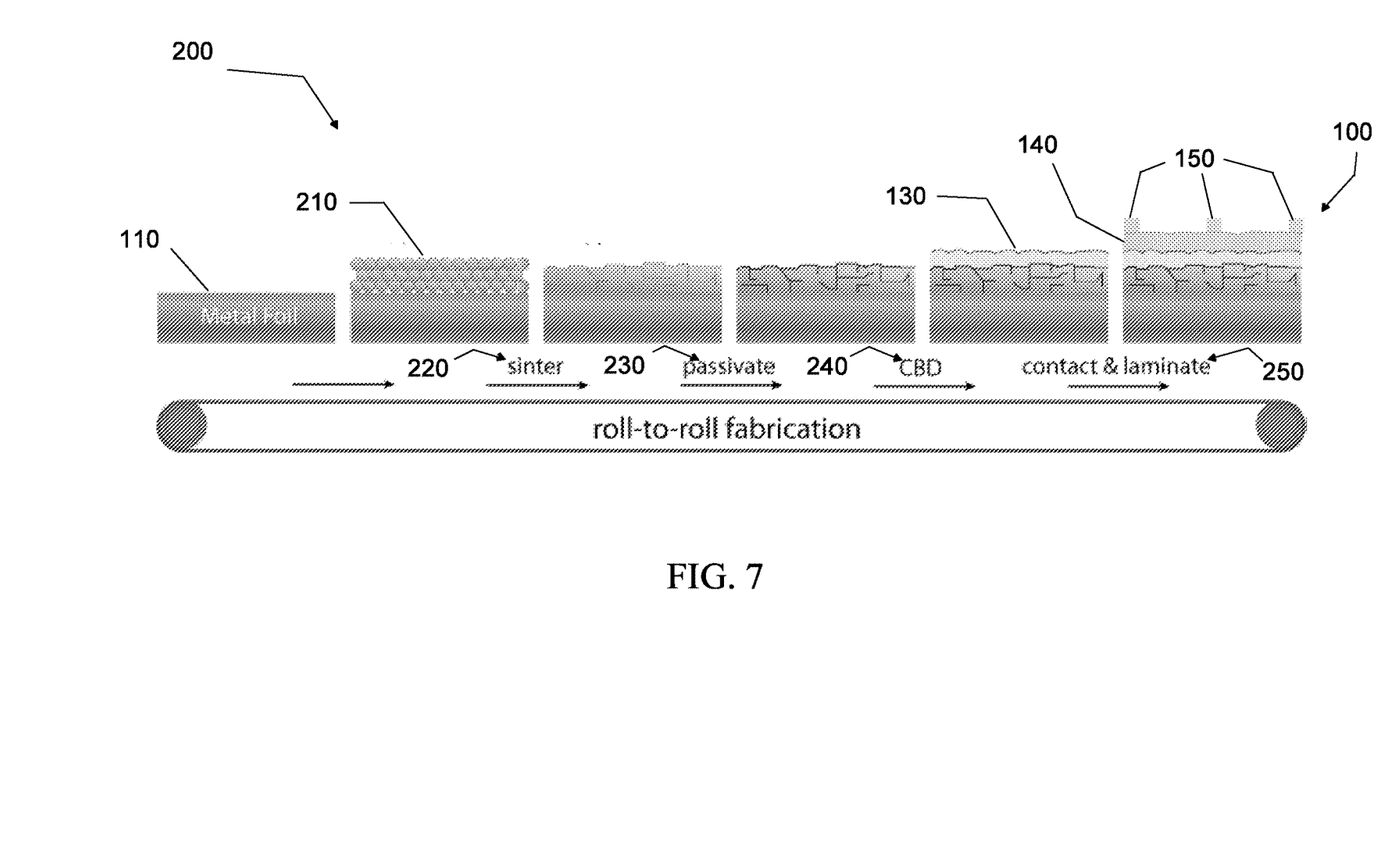
FIG. 7 depicts an exemplary embodiment of a method of manufacture of an efficient, low-cost p-n junction pyrite solar cell system from pyrite NC paints.

FIG. 7 illustrates one exemplary embodiment direct to a method of manufacture 200 of an efficient, low-cost p-n junction pyrite solar cell system 100 from pyrite NC paints. Nanocrystalline pyrite films 210 are made by dip coating, spraying, inkjet printing, or doctor blading the pyrite NC paint onto substrate layer 110. These films 210 are sintered 220 in special gas mixtures to yield stoichiometric polycrystalline pyrite films with carrier diffusion lengths that are significantly longer than the average optical absorption length. The surfaces of the films are then passivated 230 chemically to increase the surface band gap and reduce the surface recombination velocity, explained in further detail below. Window layer 130, which is explained in further detail below as a heterojunction partner, is then deposited 240 by chemical bath deposition (CBD), or other suitable deposition methods, such as atomic layer deposition (ALD), or chemical vapor deposition (CVD). The transparent top surface contact 140 is then deposited 250 by sputtering, CBD, ALD, or another suitable method.

Figure 8:
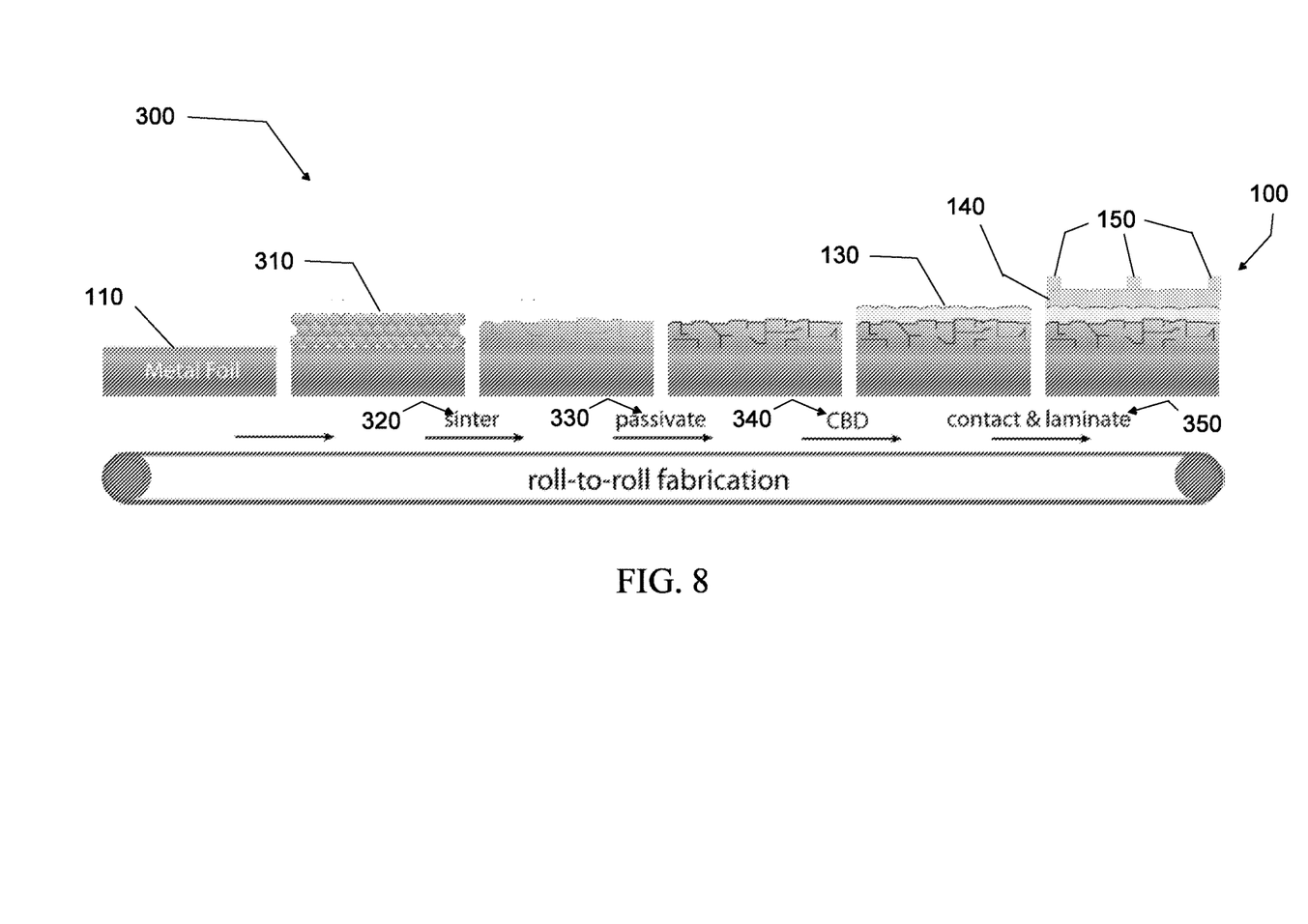
FIG. 8 depicts an exemplary embodiment of a method of manufacture of an efficient, low-cost p-n junction pyrite solar cell system from depositing microcrystalline pyrite onto foil by chemical vapor deposition (CVD).

FIG. 8 illustrates another exemplary embodiment directed to a method of manufacture 300 of an efficient, low-cost p-n junction pyrite solar cell system 100 from depositing microcrystalline pyrite onto substrate layer 110 by chemical vapor deposition (CVD). High-quality, stoichiometric pyrite thin films 310 are synthesized by growing p-type pyrite films on substrate layer 110 by CVD. These films 310 are sintered 320 in special gas mixtures to yield stoichiometric polycrystalline pyrite films with carrier diffusion lengths that are significantly longer than the average optical absorption length. The surfaces of these thin films 310 are then passivated 330 chemically to increase the surface band gap and reduce the surface recombination velocity, explained in further detail below. Window layer 130, which is explained in further detail below as a heterojunction partner, is then deposited 340 by chemical bath deposition (CBD), or other suitable deposition methods, such as atomic layer deposition (ALD), or chemical vapor deposition (CVD). The transparent top surface contact 140 is then deposited 350 by sputtering, CBD, ALD, or another suitable method.

To carry out the aforementioned methods of manufacture (200, 300) of an efficient, low-cost p-n junction pyrite solar cell system 100, exemplary embodiments of chemical passivation techniques (230, 330) are presented. Chemical passivation techniques (230, 330) are used to enhance photovoltage of p-type pyrite thin films 120 to make them commercially useful for solar cells by eliminating iron-derived gap states resulting from sulfur deficiency.

One embodiment of chemical passivation techniques (230, 330) is directed to a method of passivating defect states within the bandgap of p-type pyrite thin film 120 by moderate-temperature annealing in $S_2$, $H_2S$, and $H_2$ atmosphere.

Annealing p-type pyrite thin film 120 in a mixed $S_2$, $H_2S$, and $H_2$ atmosphere produces ideal pyrite surfaces with few gap states. Sintered pyrite films are etched in $HF/CH_3COOH/HNO_3$ or by electrochemical proton reduction and then subjected to such a sulfur anneal. These sulfurization treatments passivate fivefold-coordinate iron with sulfur monomers or dimers, thereby dramatically reducing the surface state density, unpinning the Fermi level, and yielding a significantly larger photovoltage. According to one embodiment of the present annealing passivation technique, the annealing approach is carried out using various redox couples, including $I^-/I_3^-$ and sulfur/polysulfide, in aqueous and non-aqueous electrolytes.

Another embodiment of chemical passivation techniques (230, 330) is directed to a method of passivating defect states within the bandgap of p-type pyrite thin film 120 by coordination of surface iron with organic or inorganic ligands.

This passivation scheme involves saturating the coordination sphere of surface iron atoms using suitable organic or inorganic ligands. Coordination of a sixth strong-field ligand converts the Fe ligand field from $C_{4v}$ to $O_h$ and electrostatically expels the 3d orbitals from the band gap. According to one embodiment of the present ligand passivation technique, two promising organic ligands (trimethylphosphine and ethylenediamine) are used. According to another embodiment of the present ligand passivation technique, Phosphines and amines are also good strong-field ligands for $Fe^{2+}$ and are known to adsorb to pyrite surfaces. It is appreciated that other promising organic ligands can be used in connection with the present ligand passivation technique, including short-chain alkyl xanthates (used in the froth flotation of pyrite for mineral separation), hydroxamates, ayrl thiols, and silanes. Sintered and etched pyrite films are immersed in vapors or solutions containing these ligands, and the photovoltage measured electrochemically.

According to another embodiment of chemical passivation techniques (230, 330), coordination with inorganic ligands is contemplated. Namely, sintered p-type pyrite thin film 120 is treated in organic solutions containing molecular sulfur or various compositions of sulfur, zinc, tin and silicon precursors at 100-250° C. The pure sulfur treatment sulfurizes the p-type pyrite thin film 120 surface in a fashion similar to the gas phase treatments. On the other hand, the mixed metal solutions yields inorganic molecular complexes such as $Sn_2S_6^{4-}$, $MoS_4^{2-}$, $SnS4^{4-}$ and $SiS4^{4-}$ that bind strongly to under-coordinated iron at the pyrite surface. These species eliminate Fe 3d gap states and provide a chemically robust surface on which to deposit metals and semiconductors to make Schottky contacts and p-n heterojunctions.

Another embodiment of chemical passivation techniques (230, 330) is directed to a method of passivating defect states within the bandgap of the p-type pyrite thin film 120 by controlled alloying at the pyrite 120/window 130 junction to grade the pyrite band gap and eliminate surface states. Sphalerite ZnS is a particularly promising window material because it can form high-quality epitaxial interfaces with pyrite (due to lattice matching to within 0.2%) and offers excellent transmission in the visible part of the spectrum, low toxicity, and the ability to alloy with pyrite to produce $Zn_xFe_{1-x}S_2$ interlayers with bandgaps between 1-2 eV [$E_g$($ZnS_2$)=2.4 eV]. Rapid thermal annealing is used to alloy the pyrite 120/ZnS interface to optimize the voltage of the p-n junctions.

Another embodiment of p-n junction pyrite solar cell system 100, provided herein, is directed to methods (240, 340) of forming a p-n heterojunction between passivated p-type pyrite thin film 120 and n-type emitter window layer 130. According to one embodiment, n-type emitter window layer 130 is a thin, wide bandgap semiconductor that serves (i) to form a p-n heterojunction with the p-type pyrite thin film 120, (ii) to reduce the collection losses due to surface recombination of carriers photogenerated by strongly absorbed light, and (iii) to transport electrons from the junction to top surface contact 140 (which is often Al-doped ZnO) with minimal series resistance. CdS, ZnS, and ZnO are common n-type window layers: they are cheap, non-toxic, and easy to make. Passivated p-type pyrite thin film 120 serves as substrates. Reducing front surface recombination is especially important for pyrite because of its very large absorption coefficient.

According to one embodiment of methods (240, 340), the p-n heterojunction between passivated p-type pyrite thin film 120 and n-type emitter window layer 130 is prepared by chemical bath deposition (CBD). CBD is commonly used to deposit window layers for commercial CdTe and CIGS solar cells because it produces high-quality films at low cost. Typical CBD of sulfides involves controlled precipitation from an aqueous solution of metal salt, sulfide ion and an added base. The extremely mild deposition conditions leave the pyrite surface passivation intact and yields large photovoltages from the resulting p-n junctions. It is appreciated that CBD from organic solutions may also be pursued if water is found to degrade the p-type pyrite thin film 120 surface. The diodes made by CBD will be characterized by I-V and C-V methods.

According to another embodiment of methods (240, 340), the p-n heterojunction between passivated p-type pyrite thin film 120 and n-type emitter window layer 130 is prepared by atomic layer deposition (ALD). ALD is a stepwise chemical vapor deposition method capable of growing ultrathin, dense, pinhole-free films at low temperatures and with nanometer thickness control. According to one embodiment, n-type ZnS, ZnO, and graded Al-doped ZnO n-type emitter window layers 130 are deposited onto passivated p-type pyrite thin films 120 by ALD. The layers are grown using $H_2S$ or $H_2O$ and diethyl zinc at <100° C.; these mild conditions preserve the p-type pyrite thin film 120 surface passivation and avoid loss of lattice sulfur. Although it is a slow deposition method, ALD has several unique advantages that could be exploited in solar module manufacturing. First, optical losses in window layer 130 must be minimized by keeping it as thin as possible. While very thin CBD films suffer from pinholes, ALD deposits extremely thin (5-10 nm) conformal layers that are free of pinholes. Second, depositing precisely-graded Al-doped ZnO layers is straightforward by ALD, but difficult by CBD. ALD offers an unprecedented level of control over the doping and conductivity of the window layer and top contact.

According to yet another embodiment of methods (240, 340), the p-n heterojunction between passivated p-type pyrite thin film 120 and n-type emitter window layer 130 is prepared by ZnS window layers made by low-temperature CVD of diethyl zinc and $H_2S$ at 200° C. in the commercial reactor.

Another embodiment of p-n junction pyrite solar cell system 100, provided herein, is directed to methods (250, 350) of depositing a transparent top surface contact 140. In one embodiment of methods (250, 350), top surface contact 140 is deposited onto n-type emitter window layers 130 by the method of sputtering. According to another embodiment of methods (250, 350), top surface contact 140 is deposited onto n-type emitter window layers 130 by the method of ALD.

In a further embodiment, p-n junction pyrite solar cell system 100 comprises a conductive bottom substrate 110 (for example, flexible metal foil) acting as an electrical contact; a pyrite thin film 120 produced from sintered pyrite nanocrystals or chemical vapor deposition; a semiconductor window layer 130 consisting of, for example, zinc sulfide or cadmium sulfide, used to form a junction with the pyrite layer 120 to create a photovoltaic effect; a transparent top contact 140, for example doped zinc oxide; and an encapsulation component. Additional, as illustrated in FIG. 1, p-n junction pyrite solar cell system 100 can include an adhesion layer and/or busbars 150 or other current-collecting structures.

According to one embodiment of p-n junction pyrite solar cell system 100, p-type pyrite thin film 120 includes an ohmic, low-resistivity contact between the pyrite layer and substrate layer 110. Holes that are generated in the base need to be efficiently injected into the bottom electrode without encountering a barrier to transport. However, it is not clear a priori that a pyrite/steel junction should be ohmic. Four-point conductivity measurements are used to determine the contact resistance of the pyrite/steel junctions. According to the present embodiment, if non-ohmic and/or highly resistive behavior is found at the contact between the pyrite layer and substrate layer 110, one may either replace the stainless steel with a different metal foil (e.g., Al, Cu) that provides excellent ohmic contact, or deposit a 10-20 nm-thick metal film onto the steel substrates before adding the pyrite NC layer. This metal interlayer (e.g., Al, Ni, Mo, Ti) may be deposited by thermal evaporation or sputtering. The current embodiment appreciates that diffusion, alloying, or intermetallic formation at the pyrite/metal interface during the sintering and passivation steps result in high-quality ohmic contact with at least one of these metals. As a side benefit, the interlayer may also improve the adhesion of the pyrite film to the substrate.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

What is claimed is:

1. A method for producing pyrite thin films, comprising the steps of
synthesizing colloidal pyrite nanocrystals,
purifying the colloidal pyrite nanocrystals,
depositing a p-type pyrite thin film comprising the colloidal pyrite nanocrystals onto a conductive bottom substrate, the conductive bottom substrate acting as an electrical contact; and
sintering the p-type pyrite thin film in sulfur-containing atmospheres, wherein the step of synthesizing colloidal pyrite nanocrystals comprises the steps of
creating a reaction solution by mixing FeCl2 with octadecylamine;
degassing the reaction solution;
creating an injection solution by injecting and dissolving sulfur in a solvent;
degassing the injection solution;
raising the temperature of the reaction solution;
adding the injection solution to the reaction solution to create a reaction mixture; and
heating the reaction solution for a period of time.

2. The method of claim 1 wherein the step of depositing the p-type pyrite thin film includes dipping, spinning, dropping, printing, or spraying onto the conductive bottom substrate.

3. The method of claim 1 wherein the sulfur-containing atmospheres comprise S2, H2S, or tert-butyl disulfide.

4. The method of claim 1 wherein the solvent comprises one of diphenyl ether, tri-n-octylphosphine oxide, octadecene, nonpolar organic solvent, or water.

5. The method of claim 1 wherein the step of raising the temperature of the reaction solution includes raising the temperature to 220° C.

6. The method of claim 1 wherein the period of time is 2 hours.

7. The method of claim 1 wherein the step of depositing a thin film of p-type pyrite includes depositing pyrite onto the conductive bottom substrate by chemical vapor deposition.

8. The method of claim 7 wherein the p-type pyrite is microcrystalline pyrite.

9. A method for producing pyrite thin films, comprising the steps of
synthesizing colloidal pyrite nanocrystals,
purifying the colloidal pyrite nanocrystals, depositing a p-type pyrite thin film comprising the colloidal pyrite nanocrystals onto a conductive bottom substrate, the conductive bottom substrate acting as an electrical contact; and sintering the p-type pyrite thin film in sulfur-containing atmospheres, wherein synthesizing the colloidal pyrite nanocrystals comprises the steps of:

heating $FeCl_2$ and elemental sulfur in octadecylamine and diphenyl ether; and forming colloidal pyrite nanocrystals from the heated $FeCl_2$ and elemental sulfur in octadecylamine and diphenyl ether.

10. The method of claim 9 wherein the conductive bottom substrate is flexible.

11. The method of claim 10 wherein the conductive bottom substrate comprises one of a metal foil, glass, quartz, or silicon that serves as a bottom contact in a pyrite thin film solar cell.

12. The method of claim 9 further comprising stabilizing the p-type pyrite thin film nanocrystal with ligands.

13. The method of claim 12 wherein the ligands comprise one of long-chain octadecylxanthates, alkylammonium, or alkylxanthates.

14. The method of claim 9 wherein the step of purifying the colloidal pyrite nanocrystals consists of washing the colloidal pyrite nanocrystals with a chloroform and ethanol mixture.

15. The method of claim 9 wherein the step of depositing the colloidal pyrite nanocrystals onto a substrate comprises the steps of dipping the substrate a plurality of times into a solution of colloidal pyrite nanocrystals.

16. The method of claim 15 wherein the solution of colloidal pyrite nanocrystals includes a mixture of colloidal pyrite nanocrystals and hydrazine.

17. The method of claim 9 wherein the step of heating includes heating the $FeCl_2$ and elemental sulfur in octadecylamine and diphenyl ether to 220° C. for a plurality of hours.

18. The method of claim 9 wherein the step of depositing the p-type pyrite thin film includes dipping, spinning, dropping, printing, or spraying onto the conductive bottom substrate.

19. The method of claim 9 wherein the sulfur-containing atmospheres comprise S2, H2S, or tert-butyl disulfide.

* * * * *